United States Patent
Angel et al.

(10) Patent No.: US 7,109,499 B2
(45) Date of Patent: Sep. 19, 2006

(54) APPARATUS AND METHODS FOR TWO-DIMENSIONAL ION BEAM PROFILING

(75) Inventors: Gordon C. Angel, Salem, MA (US); Edward D. MacIntosh, Amesbury, MA (US); Thomas A. Schaefer, Groveland, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 10/981,887

(22) Filed: Nov. 5, 2004

(65) Prior Publication Data

US 2006/0097195 A1    May 11, 2006

(51) Int. Cl.
  *H01J 37/04*    (2006.01)
(52) U.S. Cl. .............. 250/492.21; 250/492.2
(58) Field of Classification Search ............ 250/492.21
   See application file for complete search history.

(56) References Cited

U.S. PATENT DOCUMENTS

| | | | |
|---|---|---|---|
| 4,494,005 A | 1/1985 | Shibata et al. | |
| 4,751,393 A | 6/1988 | Corey, Jr. et al. | |
| 4,922,106 A | 5/1990 | Berrian et al. | |
| 4,980,562 A | 12/1990 | Berrian et al. | |
| 5,653,811 A | 8/1997 | Chan | |
| 5,811,823 A * | 9/1998 | Blake et al. | 250/492.21 |
| 6,020,592 A | 2/2000 | Liebert et al. | |
| 6,050,218 A | 4/2000 | Chen et al. | |
| 6,706,541 B1 | 3/2004 | Toprac et al. | |
| 6,762,423 B1 | 7/2004 | Liebert et al. | |
| 6,847,036 B1 * | 1/2005 | Darling et al. | 250/291 |

FOREIGN PATENT DOCUMENTS

EP    0 975 004 A2    1/2000

OTHER PUBLICATIONS

E.P. Eernisse et al., "*Ion Beam Profile Monitor*", Rev. Sci. Instrum., vol. 46, No. 3, Mar. 1975 pp. 266-268.

* cited by examiner

*Primary Examiner*—Kiet T. Nguyen
*Assistant Examiner*—James J. Leybourne (57) ABSTRACT

Methods and apparatus are provided for measuring a profile of an ion beam. The apparatus includes an array of beam current sensors, each producing a sensor signal in response to incident ions of the ion beam, a translation mechanism configured to translate the array of beam current sensors along a translation path with respect to the ion beam, and a controller configured to acquire the sensor signals produced by the beam current sensors at a plurality of positions along the translation path, wherein the acquired sensor signals are representative of a two-dimensional profile of the ion beam.

38 Claims, 5 Drawing Sheets

APPARATUS AND METHODS FOR TWO-DIMENSIONAL ION BEAM PROFILING

FIELD OF THE INVENTION

This invention relates to systems and methods for ion implantation and, more particularly, to methods and apparatus for measuring a two-dimensional profile of an ion beam.

BACKGROUND OF THE INVENTION

Ion implantation is a standard technique for introducing conductivity-altering impurities into semiconductor wafers. A desired impurity material is ionized in an ion source, the ions are accelerated to form an ion beam of prescribed energy and the ion beam is directed at the surface of the wafer. The energetic ions in the beam penetrate into the bulk of the semiconductor material and are embedded into the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. The beam may be distributed over the target area by beam scanning, by target movement or by a combination of beam scanning and target movement.

In one prior art approach, a high current, broad ion beam implanter employs a high current density ion source, an analyzing magnet to direct a desired species through a resolving slit and an angle corrector magnet to deflect the resulting beam, while rendering the beam parallel and uniform along its width dimension. A ribbon-shaped ion beam is delivered to a target, and the target is moved perpendicular to the long dimension of the ribbon beam to distribute the ion beam over the target.

Uniform implantation of ions over the surface of the semiconductor wafer is an important requirement in most applications. As semiconductor device geometries decrease in size and wafer diameters increase, device manufacturers demand minimal dose variation over large surface areas. Uniformity is determined, in part, by the profile of the ion beam used for ion implantation. The beam profile is a map of ion beam intensity in a plane orthogonal to the direction of beam transport. The beam current may vary over the cross-sectional area of the ion beam, particularly in the case of large area beams such as ribbon ion beams. Furthermore, the beam profile may vary with implant conditions, such as dopant species, energy and current, and with time. Accordingly, it is desirable to measure and, if necessary, adjust the beam profile in order to enhance ion implanter performance.

A dose measurement and uniformity monitoring system for ion implantation, including a mask plate with sensing apertures and an annular Faraday cup aligned with the apertures, is disclosed in U.S. Pat. No. 4,751,393 issued Jun. 14, 1988 to Corey, Jr. et al. A beam scanning control device for ion implantation, including a plurality of fixed ion beam detectors, is disclosed in U.S. Pat. No. 4,494,005 issued Jan. 15, 1985 to Shibata et al. An ion beam profile monitor, including a two-dimensional array of sample points placed in the beam, is disclosed by E. P. EerNisse et al. in Rev. Sci. Instrum., Vol. 46, No. 3, (March 1975), pp. 266–268. A method and apparatus for high efficiency scanning in an ion implanter, including a single, slowly-translating Faraday detector, is disclosed in U.S. Pat. No. 4,980,562 issued Dec. 25, 1999 to Berrian et al. All of the prior art beam measuring techniques have had one or more drawbacks, including, but not limited to, low resolution, inaccuracy and slow operation.

Accordingly, there is a need for improved methods and apparatus for ion beam profiling.

SUMMARY OF THE INVENTION

According to a first aspect of the invention, apparatus is provided for measuring a profile of an ion beam. The apparatus comprises an array of beam current sensors, each producing a sensor signal in response to incident ions of the ion beam, a translation mechanism configured to translate the array of beam current sensors along a translation path with respect to the ion beam, and a controller configured to acquire the sensor signals produced by the beam current sensors at a plurality of positions along the translation path. The acquired sensor signals are representative of a two-dimensional profile of the ion beam.

According to a second aspect of the invention, an ion implanter comprises an ion beam generator configured to generate an ion beam, a target site for supporting a target for ion implantation, and a system for measuring the ion beam. The system for measuring the ion beam comprises an array of beam current sensors, a translation mechanism configured to translate the array along a translation path with respect to the ion beam, and a controller configured to acquire the sensor signals produced by the beam current sensors at a plurality of positions along the translation path.

According to a third aspect of the invention, a method is provided for measuring an ion beam. The method comprises providing an array of beam current sensors, each producing a sensor signal in response to incident ions of the ion beam, translating the array of beam current sensors along a translation path with respect to the ion beam, and acquiring the sensor signals produced by the beam current sensors at a plurality of positions along the translation path.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
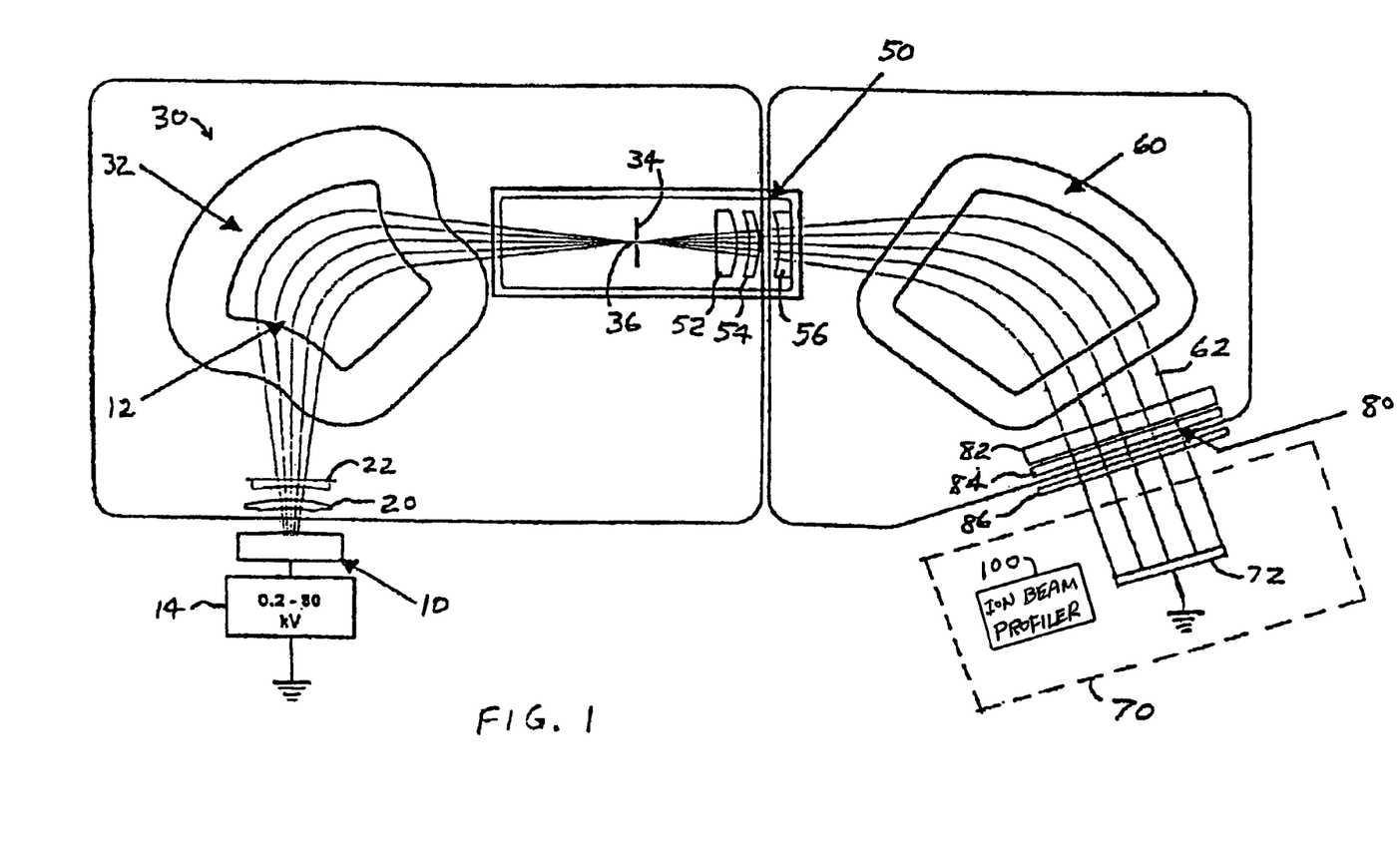
FIG. 1 is a simplified schematic diagram of an embodiment of an ion implanter.

A block diagram of an embodiment of an ion implanter is shown in FIG. 1. An ion source 10 generates ions and supplies an ion beam 12. Ion source 10 may include an ion chamber and a gas box containing a gas to be ionized. The gas is supplied to the ion chamber where it is ionized. The ions thus formed are extracted from the ion chamber to form ion beam 12. Ion beam 12 is directed between the poles of a resolving magnet 32. A first power supply 14 is connected to an extraction electrode of ion source 10 and provides a positive first voltage $V_0$. First voltage $V_0$ may be adjustable, for example, from about 0.2 to a 80 kV. Thus, ions from ion source 10 are accelerated to energies of about 0.2 to 80 KeV by the first voltage $V_0$.

Ion beam 12 passes through a suppression electrode 20 and a ground electrode 22 to a mass analyzer 30. The mass analyzer 30 includes resolving magnet 32 and a masking electrode 34 having a resolving aperture 36. Resolving magnet 32 deflects ions in ion beam 12 such that ions of a desired ion species pass through resolving aperture 36 and undesired ion species do not pass through resolving aperture 36 but are blocked by the masking electrode 34. In one embodiment, resolving magnet 32 deflects ions of the desired species by 90°.

Ions of the desired ion species pass through resolving aperture 36 to a first deceleration stage 50 positioned downstream of mass analyzer 30. Deceleration stage 50 may include an upstream electrode 52, a suppression electrode 54 and a downstream electrode 56. Ions in the ion beam may be decelerated by deceleration stage 50 and then pass through an angle corrector magnet 60. Angle corrector magnet 60 deflects ions of the desired ion species and converts the ion beam from a diverging ion beam to a ribbon ion beam 62 having substantially parallel ion trajectories. In one embodiment, angle corrector magnet 60 deflects ions of the desired ion species by 70°.

An end station 70 supports one or more semiconductor wafers, such as wafer 72, in the path of ribbon ion beam 62 such that ions of the desired species are implanted into the semiconductor wafer. The end station 70 may include a cooled electrostatic platen and a scanner (not shown) for moving wafer 72 perpendicular to the long dimension of the ribbon ion beam 62 cross-section, so as to distribute ions over the surface of wafer 72. The ribbon ion beam may be at least as wide as wafer 72.

The ion implanter may include a second deceleration stage 80 positioned downstream of angle corrector magnet 60. Deceleration stage 80 may include an upstream electrode 82, a suppression electrode 84 and a downstream electrode 86.

The ion implanter may include additional components known to those skilled in the art. For example, end station 70 typically includes automated wafer handling equipment for introducing wafers into the ion implanter and for removing wafers after ion implantation. End station 70 may also include a dose measuring system, an electron flood gun and other known components. It will be understood that the entire path traversed by the ion beam is evacuated during ion implantation.

The ion implanter of FIG. 1 may operate in one of several modes. In a first operating mode, known as the drift mode, deceleration stages 50 and 80 are connected to ground, and the ion beam 12 is transported through the beamline at the final beam energy established after extraction from ion source 10. In a second operating mode, known as the enhanced drift mode, the ion beam 12 is accelerated to an intermediate energy at electrode 22 before passing through mass analyzer 30 and then is decelerated to the final beam energy by first deceleration stage 50. In a third operating mode, known as the double deceleration mode, the ion beam is accelerated to a first intermediate energy at electrode 22 before passing through mass analyzer 30, is decelerated by first deceleration stage 50 to a second intermediate energy as it passes through angle corrector 60 and then is decelerated to the final beam energy by second deceleration stage 80. A fourth operating mode transports the beam at the intermediate energy through to the second deceleration stage 80, and the gap at the first deceleration stage 50 is operated with a short circuit shunt. By transporting the ion beam through part of the beamline at higher energy, space charge expansion can be reduced in comparison with the drift mode for a given final beam energy.

Figure 2:
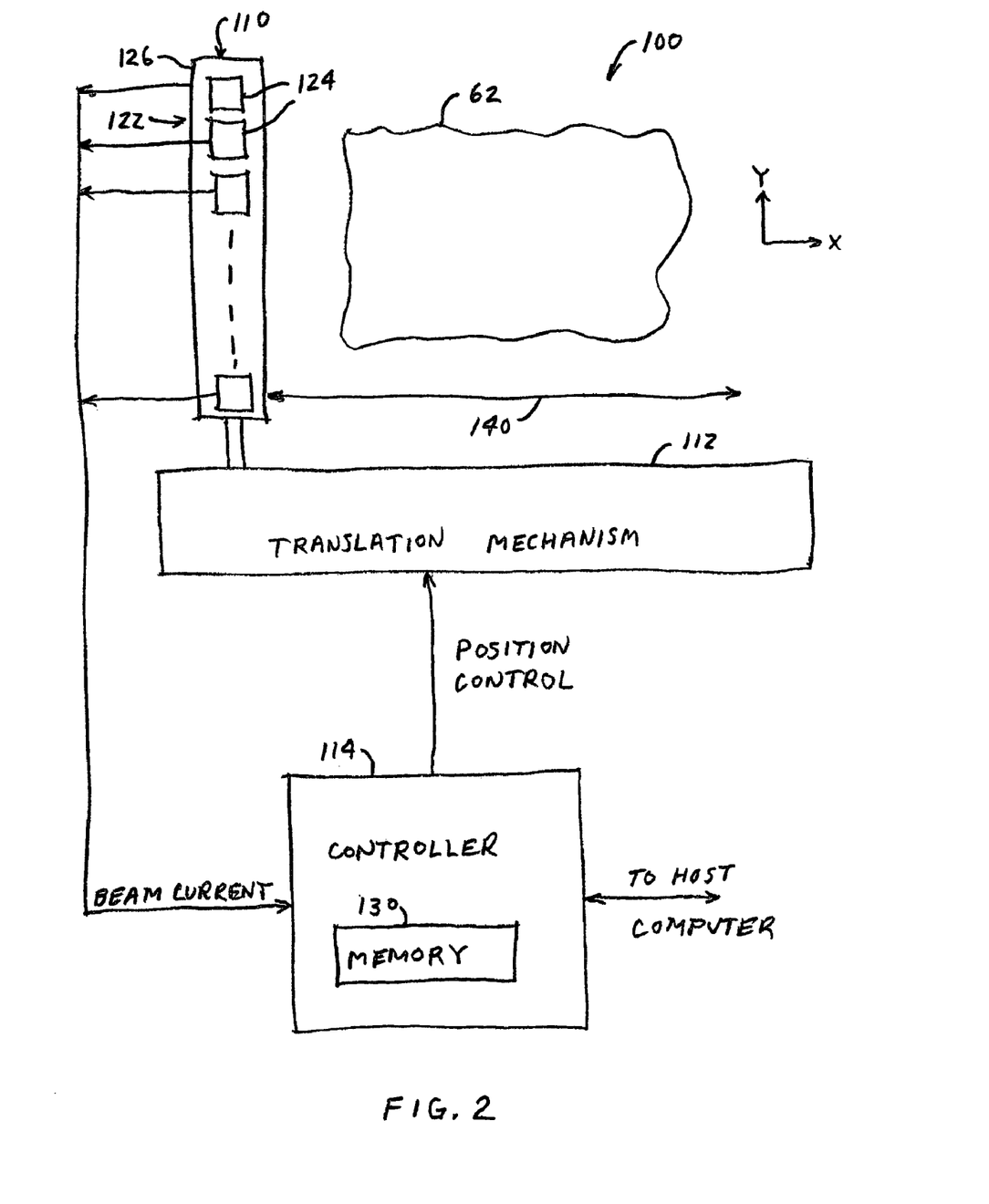
FIG. 2 is a schematic block diagram of apparatus for measuring a two-dimensional profile of an ion beam in accordance with an embodiment of the invention.

In accordance with a feature of the invention, end station 70 may include an ion beam profiler 100 as shown in FIG. 1. A block diagram of ion beam profiler 100 in accordance with an embodiment of the invention is shown in FIG. 2. Ion beam profiler 100 is configured to acquire a profile of a cross section of ion beam 62, typically in a plane orthogonal to the direction of ion beam transport. The direction of beam transport is perpendicular to the plane of FIG. 2. Typically, the ion beam profile in or near the plane of wafer 72 is of interest. However, ion beam profiler 100 can acquire the ion beam profile in any desired plane.

The beam profiler measures beam current in incremental areas over the cross-sectional area of the ion beam to obtain a beam profile in the form of a two-dimensional map of beam current density. The two-dimensional map may be configured as an X-Y array of pixels, each of which contains a measured value of beam current density in an incremental area of the beam cross section. The pixel values may be measured as described below. The two-dimensional map of beam current density may be utilized to confirm that the ion beam profile is within specification. If the beam profile is not within specification, the beam profile may be adjusted and an updated beam profile may be acquired to confirm the adjustment. Other uses of the two-dimensional beam profile may be contemplated within the scope of the invention.

Referring to FIG. 2, ion beam profiler 100 may include a beam sensing assembly 110, a translation mechanism 112 and controller 114. Ion beam profiler 100 is configured for measuring the two-dimensional profile of ion beam 62. As discussed below, the ion beam profiler may be configured for measuring an ion beam having an arbitrary cross-sectional shape and size.

Beam sensing assembly 110 includes an array 122 of beam current sensors 124 mounted to a frame or housing 126. Beam current sensors 124 may be Faraday cups which produce an electrical signal in response to an intercepted ion beam. As known in the art, the magnitude of the sensor signal is a function of the intercepted ion beam current. Each beam current sensor may be a cup-shaped conductor with an aperture that faces the ion beam. The size of the aperture determines the area of the ion beam that is sampled by the beam current sensor.

In the embodiment of FIG. 2, the array 122 is a linear array of beam current sensors 124 which are equally spaced along a Y direction. As described below, other array configurations may be utilized within the scope of the invention.

The beam sensing assembly 110 is translated along a translation path 140 in an X direction by translation mechanism 112 to cover the entire cross-sectional area of ion beam 62. Beam current measurements are acquired from each of beam current sensors 124 as beam sensing assembly 110 is translated along translation path 140. The beam current measurements may be acquired when sensing assembly 110 is moving or, in the case of stepwise movement, each time sensing assembly 110 stops along translation path 140. The sensor signals generated by beam current sensors 124 may be measured continuously or may be sampled at desired intervals. The current measurements are supplied to controller 114 for storage in a memory 130 and/or transmission to a host computer. The set of measurements as beam sensing assembly 110 is translated across ion beam 62 represents a two-dimensional map of beam current density of ion beam 62. The set of current measurements may be used to generate a display or a printout of the ion beam profile.

The parameters of ion beam profiler 100 depend on the characteristics of ion beam 62, such as beam current and cross-sectional dimensions and shape, and on the desired resolution and measuring speed. In the embodiment of FIG. 2 where array 122 includes beam current sensors 124 along the Y direction, the length of array 122 should be at least as large as the maximum expected height of ion beam 62. The length of translation path 140 of beam sensing assembly 110 should be at least as large as the maximum expected width of ion beam 62. The size of beam current sensors 124 in array 122 depends on the desired resolution of the beam profile and on the ability of the sensor to produce an acceptable signal level. Individual beam current sensors 124 may sense abutting areas so as to provide a contiguous profile of the entire ion beam.

The translation of beam sensing assembly 110 along translation path 140 may be continuous or in discrete steps. In one embodiment, beam sensing assembly 110 is translated in steps equal to one half the width of the apertures in beam current sensors 124. In that embodiment, the ion beam profiler 100 acquires a two-dimensional beam profile including rows and columns of pixels, each containing a measured current value. The array 122 of beam current sensors 124 defines a column of pixels, and the rows of pixels are defined by each beam current sensor 124 as it is translated along translation path 140.

The translation mechanism 112 may utilize a rack and pinion drive mechanism, for example. Other suitable translation mechanisms include a ball and screw assembly, a linear motor and an air piston.

As shown in FIG. 2, controller 114 may provide position control signals to translation mechanism 112 to control translation of beam sensing assembly 110 along translation path 140. For example, controller 114 may control translation mechanism 112 to translate beam sensing assembly 110 in steps across ion beam 62 and to record the beam current sensed by each of the beam current sensors 124 at each position. The measured current values and the corresponding positions form a data set which represents the two-dimensional ion beam profile. The data set may be stored in memory 130 and/or transmitted to a host computer.

In the embodiment of FIG. 2, beam sensing assembly 110 includes beam current sensors 124 positioned along the Y direction, and the beam sensing assembly 110 is translated in the X direction. In other embodiments, beam current sensors 124 can be positioned along the X direction, and the beam sensing assembly can be translated along the Y direction. In addition, the beam sensing assembly 110 is not necessarily aligned with the X direction or the Y direction.

Figure 3:
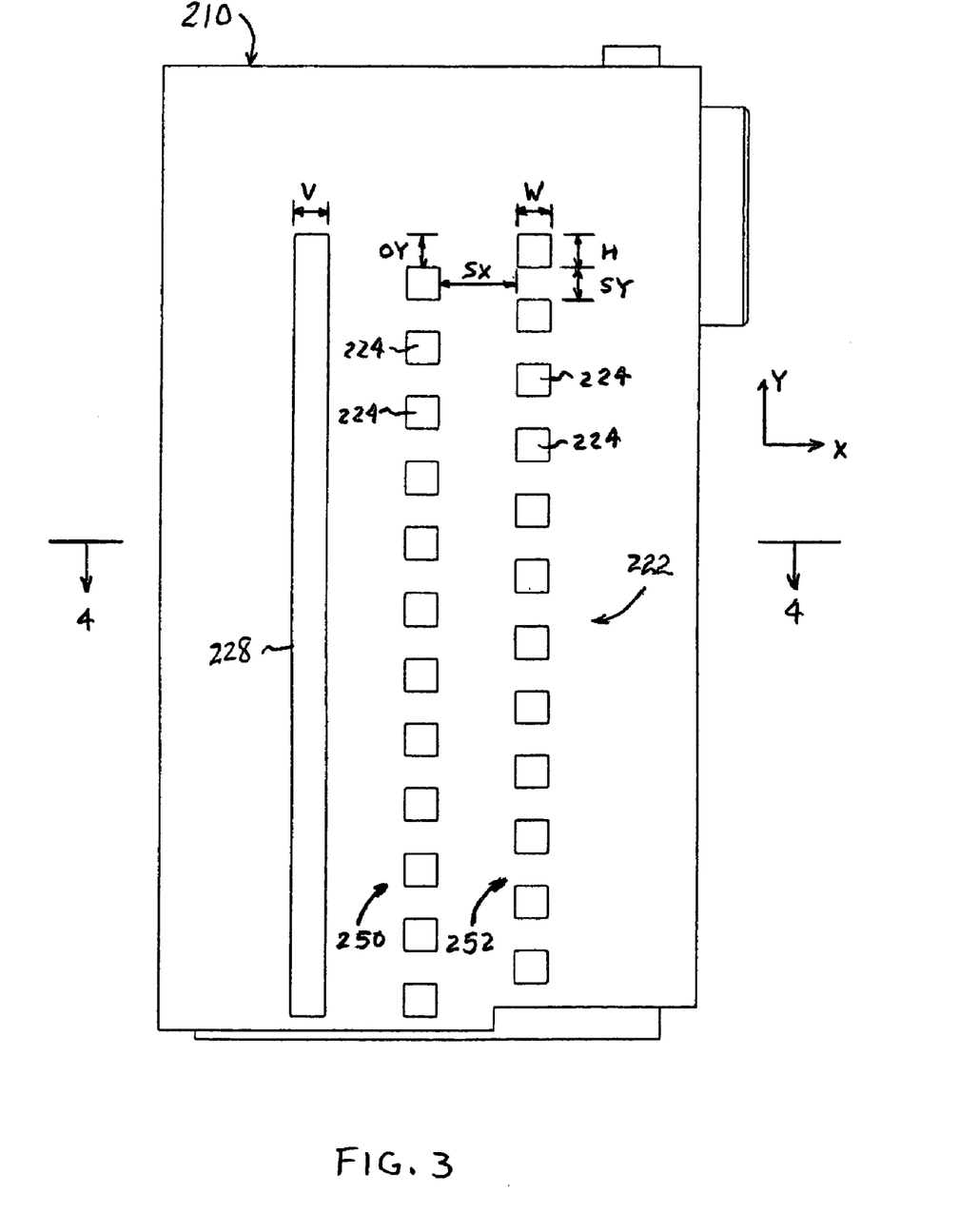
FIG. 3 is a front view of a beam sensing assembly in accordance with an embodiment of the invention.
Figure 4:
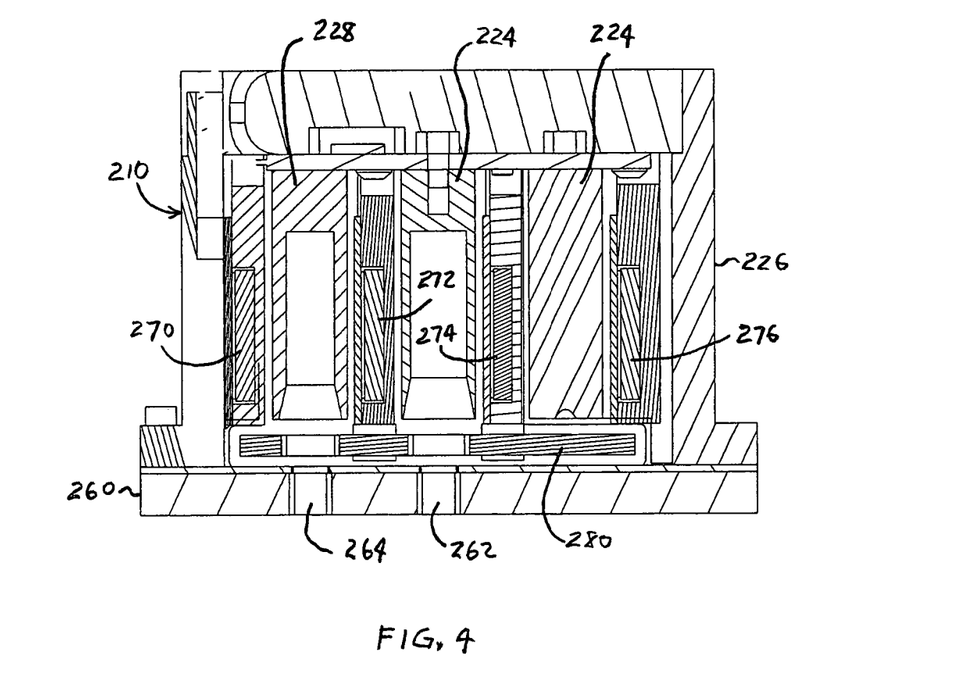
FIG. 4 is a cross-sectional view of the beam sensing assembly, taken along the line 4—4 of FIG. 3.

An implementation of a beam sensing assembly in accordance with an embodiment of the invention is shown in FIGS. 3 and 4. In the embodiment of FIGS. 3 and 4, a beam sensing assembly 210 includes a housing 226, an array 222 of beam current sensors 224 and a single, elongated beam current sensor 228. Array 222 includes a first subarray 250 of beam current sensors 224 and a second subarray 252 of beam current sensors 224. The first and second subarrays 250 and 252 each include a linear arrangement of beam current sensors, with the beam current sensors of subarray 252 being offset in the Y direction by an offset OY with respect to first subarray 250. This array configuration permits measurement of the ion beam along a contiguous strip of ion beam 62.

As shown in FIG. 4, beam current sensors 224 and 228 are mounted in housing 226. Housing 226 is enclosed by a cover 260 having apertures 262 and 264 which define the incremental areas of the ion beam 62 that are sensed by the respective beam current sensors. In particular, aperture 262 defines an area sensed by beam current sensor 224, and aperture 264 is an elongated slot that defines the area sensed by beam current sensor 228.

One of the difficulties in acquiring a two-dimensional beam profile, particularly when measuring low ion beam currents, is to insure that only the current due to the ion beam is measured. The profiler operates in a region of the ion implanter where electrons and low energy ions are also present, generated both through collisions of the ion beam with the background gas and by introduction from an electron flood gun used to neutralize charge on the wafer. The flood gun may be located immediately upstream of the profiler in the beamline. The beam profiler may be provided with suppression elements for suppressing entry of electrons and low energy ions into the beam current sensors.

The beam sensing assembly may include magnets to prevent low energy electrons from entering the beam current sensors along with the beam ions or from leaving the beam current sensors once the ions have entered. Referring again to FIG. 4, beam sensing assembly 210 may include magnets 270, 272, 274 and 276 positioned on opposite sides of beam current sensors 224 and 228. In the embodiment of FIG. 4, magnets 270, 272, 274 and 276 may be aligned with their respective north and south poles facing each other to produce a dipole field in the entrance to beam current sensors 224 and 228. The magnets are selected to produce magnetic fields at the center of each beam current sensor which are orthogonal to the direction of beam transport and which have a magnitude of about 500–600 Gauss. It will be understood that these parameters are given by way of example only and are not limiting as to the scope of the invention.

The beam sensing assembly 210 may also include a positively-biased plate 280 positioned in front of the beam current sensors to prevent low energy ions, particularly those generated by the flood gun, from entering the beam current sensors along with the beam ions and being measured as part of the ion beam current. By way of example, plate 280 may be biased at a voltage of about +20 volts.

Figure 5:
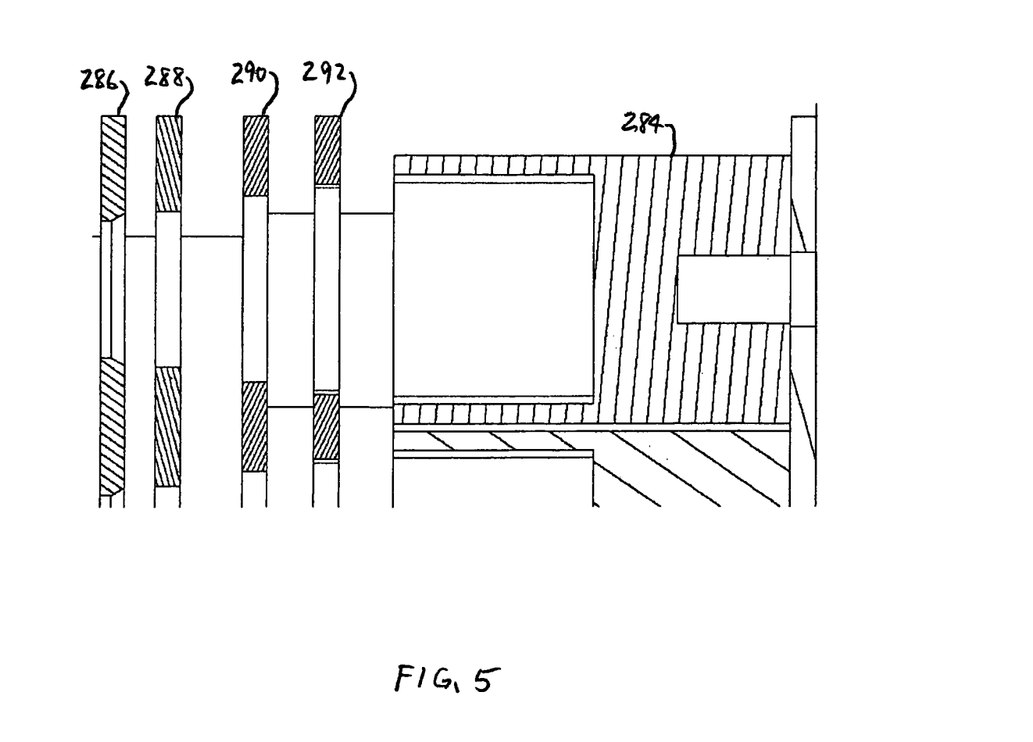
FIG. 5 is a schematic cross-sectional view of a beam current sensor with suppression electrodes in accordance with another embodiment of the invention.

Another embodiment of a beam current sensor including suppression elements for electron and low energy ion suppression is shown in FIG. 5. A beam current sensor 284 may be configured as a Faraday cup. Electrons and low energy ions are suppressed by an arrangement including a ground plate 286, a negative suppression plate 288, a positive suppression plate 290 and a negative suppression plate 292. In the embodiment of FIG. 5, ground plate 286 is connected to ground, negative suppression plates 288 and 292 are biased at −200 volts and positive suppression plate 290 is biased at +400 volts. Positive suppression plate 290, which prevents low energy ions from entering the beam current sensor, is separated from the beamline and from the beam current sensor by negatively-biased plates which prevent electrons in the beamline from entering the Faraday cup and electrons from leaving the Faraday cup. In the absence of suppression magnets, the positively-biased plate alone would prevent low energy ions from entering the Faraday cup but would also distort the electron flow.

In the embodiment of FIGS. 3 and 4, each of beam current sensors 224 has height H and a width W, and adjacent beam current sensors are spaced apart in the Y direction by a spacing SY that is equal to height H. Subarrays 250 and 252 are spaced apart in the X direction by a spacing SX. The arrangement of two spaced-apart subarrays of beam current sensors avoids any gap in measurement which would otherwise result from the wall thicknesses of individual beam current sensors arranged in a single linear array. Beam current measurement along a contiguous strip of ion beam 62 includes a first measurement with subarray 252 at a specified X position, translation of beam sensing assembly 210 in the X direction by a distance equal to the width W plus the spacing SX and a second measurement at the same X position with subarray 250. The two sets of measurements are combined to provide a beam profile along a contiguous strip of the ion beam at a given X position. In practice, measurements are acquired simultaneously by subarrays 250 and 252 at different X positions, and the beam sensing assembly 210 is translated along the X direction to provide a complete data set. The acquired current values are appropriately processed to provide contiguous data values in X and Y directions. Thus, current values acquired by subarrays 250 and 252 at the same X position are combined to provide a single column of the profile data set. The beam sensing assembly may include a single array of beam current sensors or two or more subarrays of beam current sensors.

In one example, each beam current sensor 224 has a height H of 6 mm (millimeters) and a width W of 6 mm, and the spacing SY between sensors in each column is 6 mm. The offset OY between subarrays 250 and 252 is 6 mm, and the spacing SX between subarrays 250 and 252 is 12 mm. Beam sensing assembly 110 may be translated along the X direction in increments of 3 mm, for example. Each of subarrays 250 and 252 may include 12 beam current sensors in this example for a total measurement height of 144 mm. The height H and width W of beam current sensors 224 is selected to collect an acceptable signal level in applications of interest and to provide a desired resolution. The length of translation path 140 may be equal to or greater than the width of ion beam 60 and in one example is 400 mm. In this example, a two-dimensional ion beam profile can be acquired in two seconds. It will be understood that these parameters are given by way of example only and are not limiting as to the scope of the present invention.

Beam current sensor 228 may be configured as a single beam current sensor having an area equal to the total areas of the beam current sensors 224 in array 222. More particularly, beam current sensor 228 may have a width V equal to the width W of beam current sensors 224 and may have a length that is equal to the total length of array 222 along the Y direction. Beam current sensor 228 may be used to confirm operation of sensors 224 in array 222. The beam current measured by beam current sensor 228 at a particular X position should be equal to the total current measured by subarrays 250 and 252 at the same X position. Beam current sensor 228 averages variations in beam current density along the Y direction to produce a single measured current value for each X position. Thus, beam current sensor 228 provides a one-dimensional beam profile.

The embodiment of FIGS. 3 and 4 includes two subarrays that measure a contiguous strip of the ion beam. In other embodiments, the beam current sensors are spaced apart along the Y direction and interpolation is used to estimate beam current at positions between sensors. Array 122 shown in FIG. 2 and described above is an example of spaced-apart beam current sensors 124. In further embodiments, the beam current sensors have overlapping measurement areas.

Figure 6:
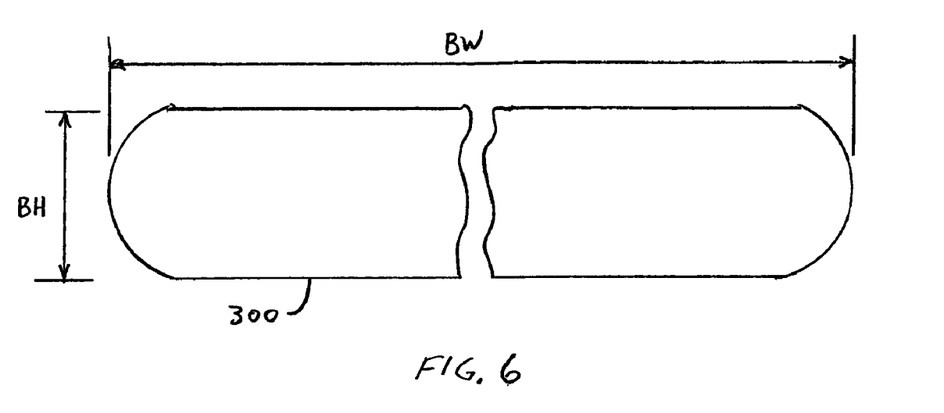
FIG. 6 illustrates a cross section of a ribbon ion beam.

Different ion beam types can be profiled by the ion beam profiler shown and described herein. Referring to FIG. 6, a ribbon ion beam 300 typically has an elongated cross section characterized by a beam height BH and a beam width BW. The length of the array of beam sensors in the Y direction is selected to be equal to or greater than beam height BH, and the length of translation path 140 in the X direction is selected to be equal to or greater than the beam width BW. It is typically most practical to translate the beam sensing assembly along the long dimension of the ion beam cross section. However, the invention is not limited in this regard. Thus, for example, a horizontal array of beam current sensors can be translated in the vertical direction to acquire a profile of ribbon ion beam 300.

Figure 7:
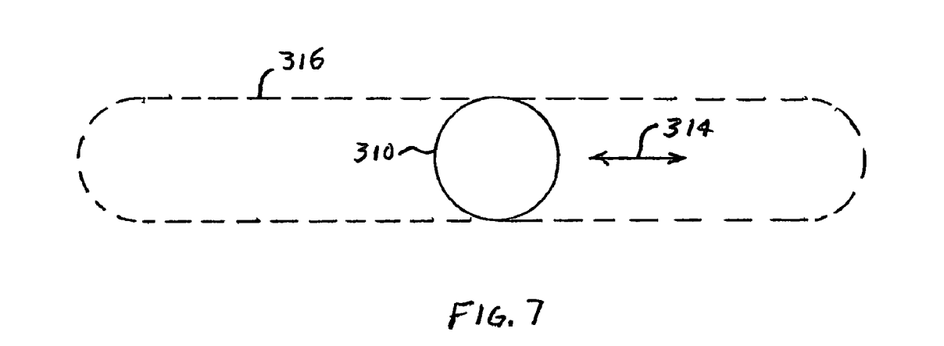
FIG. 7 illustrates a cross section of a scanned ion beam.

Referring to FIG. 7, the ion beam profiler of the present invention can be utilized to acquire the profile of a scanned ion beam. In FIG. 7, ion beam 310 is scanned along a scan direction 314 to provide a scan pattern 316. The ion beam profiler can be utilized to acquire the profile of scan pattern 316 along scan direction 314. In the example of FIG. 7, the beam sensing assembly is translated along scan direction 314, and the translation path has a length equal to or greater than the width of scan pattern 316. The speed of translation of the beam sensing assembly is slow in comparison with the beam scanning speed to ensure that ion beam 310 is measured at least once at each position along the translation path.

Figure 8:
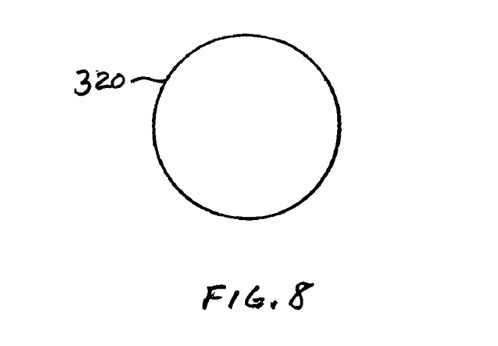
FIG. 8 illustrates a cross section of a spot ion beam.

A spot ion beam 320 is shown in FIG. 8. To acquire the profile of spot ion beam 320, the height of the array of beam current sensors and the length of the translation path are both equal to or greater than the maximum expected diameter of ion beam 320. It will be understood that the spot ion beam 320 does not necessarily have a circular cross section and in general has an irregular cross-sectional shape.

For any of the beam types, the length of the beam current sensor array and the length of the translation paths are preferably somewhat larger than the maximum expected beam dimensions or scan pattern dimensions to accommodate abnormal ion beam conditions. The array of beam current sensors can have any desired configuration of individual beam current sensors and can be translated in the X direction, in the Y direction or in an arbitrary direction.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. Apparatus for measuring a profile of an ion beam, comprising:

an array of beam current sensors, each producing a sensor signal in response to incident ions of the ion beam;

a translation mechanism configured to translate the array of beam current sensors along a translation path with respect to the ion beam;

a controller configured to acquire the sensor signals produced by the beam current sensors at a plurality of positions along the translation path, wherein the acquired sensor signals are representative of a two-dimensional profile of the ion beam; and a single beam current sensor having an area substantially equal to a sum of areas of the beam current sensors in the array, wherein the single beam current sensor is translated with the array of beam current sensors and produces a sensor signal to check operation of the array of beam current sensors.

2. Apparatus as defined in claim 1, wherein the controller is configured to control translation of the array of beam current sensors along the translation path.

3. Apparatus as defined in claim 1, wherein the translation mechanism is configured to translate the array of beam current sensors in discrete steps along the translation path.

4. Apparatus as defined in claim 1, wherein the translation mechanism is configured to translate the array of beam current sensors continuously along the translation path.

5. Apparatus as defined in claim 1, wherein the translation mechanism is configured to translate the array of beam current sensors generally orthogonal to a direction of ion beam transport.

6. Apparatus as defined in claim 1, wherein the array of beam current sensors comprises a linear array.

7. Apparatus as defined in claim 1, wherein the array of beam current sensors comprises an array of Faraday cups.

8. Apparatus as defined in claim 1, wherein the array of beam current sensors comprises first and second subarrays of Faraday cups, wherein the first and second subarrays of Faraday cups are offset from each other in the direction of the translation and are offset from each other orthogonal to the direction of translation.

9. Apparatus as defined in claim 1, wherein the controller is configured to produce a data set representative of the two-dimensional profile of the ion beam in response to the acquired sensor signals at the plurality of positions along the translation path.

10. Apparatus as defined in claim 9, wherein each member of the data set includes a measured current value and a corresponding position.

11. Apparatus as defined in claim 1, configured for measuring a ribbon ion beam having a cross section with a long dimension and wherein the translation mechanism is configured to translate the array of beam current sensors along the long dimension of the ribbon ion beam cross section.

12. Apparatus as defined in claim 1, configured for measuring a scanned ion beam having a scan direction, wherein the translation mechanism is configured to translate the array of beam current sensors along the scan direction.

13. Apparatus as defined in claim 12, wherein translation of the array of beam current sensors is slow in comparison with scanning of the ion beam.

14. Apparatus as defined in claim 1, configured to measure a profile of a spot ion beam, wherein the translation mechanism is configured to translate the array of beam current sensors with respect to the spot ion beam.

15. Apparatus as defined in claim 1, wherein the single beam current sensor comprises a single elongated Faraday cup.

16. Apparatus as defined in claim 1, wherein the beam current sensors are configured to sense a contiguous strip of the ion beam in a direction orthogonal to the translation path.

17. Apparatus as defined in claim 1, wherein the beam current sensors are spaced-apart in a direction orthogonal to the translation path.

18. Apparatus as defined in claim 1, further including one or more suppression elements to suppress entry of electrons and low energy ions into the beam current sensors.

19. Apparatus as defined in claim 18, wherein the suppression elements include magnets to suppress entry of electrons into the beam current sensors and a positively-biased plate to suppress entry of low energy ions into the beam current sensors.

20. Apparatus as defined in claim 18, wherein the suppression elements include a positively-biased plate to suppress entry of low energy ions into the beam current sensors and one or more negatively-biased plates to suppress entry of electrons into the beam current sensors.

21. An ion implanter comprising:
an ion beam generator configured to generate an ion beam;
a target site for supporting a target for ion implantation; and
apparatus for measuring the ion beam, comprising an array of beam current sensors, a translation mechanism configured to translate the array of beam current sensors along a translation path with respect to the ion beam, end a controller configured to acquire the sensor signals produced by the beam current sensors at a plurality of positions along the translation path, and a single beam current sensor having an area substantially equal to a sum of areas of the beam current sensors in the array, wherein the single beam current sensor is translated with the array of beam current sensors and produces a sensor signal to check operation of the array of beam current sensors.

22. An ion implanter as defined in claim 21, wherein the controller is configured to control translation of the array of beam current sensors along the translation path.

23. An ion implanter as defined in claim 21, wherein the translation mechanism is configured to translate the array of beam current sensors in discrete steps along the translation path.

24. An ion implanter as defined in claim 21, wherein the translation mechanism is configured to translate the array of beam current sensors continuously along the translation path.

25. An ion implanter as defined in claim 21, wherein the translation mechanism is configured to translate the array of beam current sensors generally orthogonal to a direction of ion beam transport.

26. An ion implanter as defined in claim 21, wherein the array of beam current sensors comprises first and second subarrays of Faraday cups, wherein the first and second subarrays of Faraday cups are offset from each other in the direction of translation and are offset from each other orthogonal to the direction of translation.

27. An ion implanter as defined in claim 21, wherein the controller is configured to produce a data set representative of a two-dimensional profile of the ion beam in response to the sensor signals produced by the beam current sensors at the plurality of positions along the translation path.

28. An ion implanter as defined in claim 27, wherein each member of the data set includes a measured current value and a corresponding position.

29. An ion implanter as defined in claim 21, configured for measuring a ribbon ion beam having a cross section with a long dimension and wherein the translation mechanism is configured to translate the array of beam current sensors along the long dimension of the ribbon ion beam cross section.

30. A method for measuring an ion beam, comprising:
providing an array of beam current sensors, each producing a sensor signal in response to incident ions of the ion beam;
providing a single beam current sensor having an area substantially equal to a sum of areas of the beam current sensors in the array, the single beam current sensor producing a sensor signal in response to incident ions of the ion beam to check operation of the array of beam current sensors;

translating the array of beam current sensors and the single beam current sensor along a translation path with respect to the ion beam; and acquiring the sensor signals produced by the array of beam current sensors and the single beam current sensor at a plurality of positions along the translation path.

31. A method as defined in claim 30, wherein translating the array and the single beam current sensor comprises translating the array of beam current sensors and the single beam current sensor in discrete steps along the translation path.

32. A method as defined in claim 30, wherein translating the array and the single beam current sensor comprises translating the array of beam current sensors and the single beam current sensor continuously along the translation path.

33. A method as defined in claim 30, wherein translating the array comprises translating the array of beam current sensors generally orthogonal to a direction of ion beam transport.

34. A method as defined in claim 30, further comprising producing a data set representative of a two-dimensional profile of the ion beam in response to the sensor signals produced by the beam current sensors at the plurality of positions along the translation path.

35. A method as defined in claim 34, wherein each member of the data set includes a measured current value and a corresponding position.

36. A method as defined in claim 30, wherein providing an array of beam current sensors comprises providing an array configured to sense a contiguous strip of the ion beam in a direction orthogonal to the translation path.

37. A method as defined in claim 30, wherein providing an array of beam current sensors comprises providing spaced-apart beam current sensors, the method further comprising interpolating the acquired sensor signals to provide an estimate of beam current along a strip of the ion beam in a direction orthogonal to the translation path.

38. A method as defined in claim 30, further comprising suppressing entry of electrons and low energy ions into the beam current sensors.

* * * * *